(12) United States Patent
Chen et al.

(10) Patent No.: US 12,362,714 B2
(45) Date of Patent: Jul. 15, 2025

(54) SIGNAL RECEIVING APPARATUS AND PROGRAMMABLE GAIN AMPLIFIER HAVING MODE-SWITCHING MECHANISM

(71) Applicant: REALTEK SEMICONDUCTOR CORPORATION, Hsinchu (TW)

(72) Inventors: Yun-Tse Chen, Hsinchu (TW); Kai-Yin Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 551 days.

(21) Appl. No.: 17/865,810

(22) Filed: Jul. 15, 2022

(65) Prior Publication Data

US 2023/0179156 A1    Jun. 8, 2023

(51) Int. Cl.
*H03F 3/45*    (2006.01)
*H03G 3/20*    (2006.01)
(Continued)

(52) U.S. Cl.
CPC ........... *H03F 3/45076* (2013.01); *H03H 7/12* (2013.01); *H03H 19/004* (2013.01); *H03G 1/0088* (2013.01)

(58) Field of Classification Search
CPC .. H03F 3/45076; H03F 3/195; H03F 3/45475; H03F 2200/451;
(Continued)

(56) References Cited

U.S. PATENT DOCUMENTS 8,111,097 B1 * 2/2012 Kutz ..................... H03K 25/04
330/86
2015/0116035 A1    4/2015 Dey

FOREIGN PATENT DOCUMENTS

TW    I738575    9/2021

OTHER PUBLICATIONS

OA letter of a counterpart TW application (appl. No. 110144986) mailed on Apr. 18, 2022. Summary of the TW OA letter: 1. Claims 1 and 6 are rejected as allegedly being unpatentable in view of cited reference 1 (TWI738575) and cited reference 2 (US2015/0116035A1). 2. Claims 2~5 and 7~10 are allowable. Correspondence bewteen claims of TW counterpart application and claims of US application:1. Claims 1, 2-3, . . . , and 10 in TW counterpart application correspond to claims 1, 2-3, . . . and 10 in US application, respectively.

* cited by examiner

*Primary Examiner* — Andrea Lindgren Baltzell
*Assistant Examiner* — Nareh Shamiryan
(74) *Attorney, Agent, or Firm* — WPAT, PC (57) ABSTRACT

The present invention discloses a programmable gain amplifier having mode-switching mechanism. An operational amplifier includes a first input terminal, a second input terminal and an output terminal. The second input terminal is coupled to a ground terminal. The output terminal generates an output signal. A variable resistor and a first switch are coupled in series between a first terminal and a second terminal that coupled to the first input terminal. A first variable capacitor and a second switch are coupled in series between the first terminal and the second terminal. A second variable capacitor and a third switch are coupled in series between the first terminal and the ground terminal. A low-pass resistor and a low-pass capacitor are coupled in parallel between the first input terminal and the output terminal. An input resistor is coupled between a signal input terminal and the first terminal to receive an input signal from the signal input terminal. The first, the second and the third switches receive a set of mode-switching signals to switch to form a path or an open-circuit.

10 Claims, 5 Drawing Sheets

(51) Int. Cl.
*H03H 7/12* (2006.01)
*H03H 19/00* (2006.01)
*H03G 1/00* (2006.01)

(58) Field of Classification Search
CPC . H03F 2203/45526; H03F 2203/45551; H03F 2203/45591; H03H 7/12; H03H 19/004; H03H 11/126; H03H 11/1204; H03G 3/3052
USPC .................. 330/252–261, 9, 51, 86, 282
See application file for complete search history.

SIGNAL RECEIVING APPARATUS AND PROGRAMMABLE GAIN AMPLIFIER HAVING MODE-SWITCHING MECHANISM

BACKGROUND OF THE INVENTION

1. Field of the Invention

The present invention relates to a signal receiving apparatus and a programmable gain amplifier having mode-switching mechanism.

2. Description of Related Art

In a communication system, when a signal is transmitted through a medium, signal attenuation occurs due to insertion loss or return loss. In order to solve the issue of signal attenuation, a signal amplifier is required to be disposed in a signal receiving apparatus to perform compensation.

However, in order to deal with the network communication of different connection speeds and bandwidths, the conventional signal receiving apparatus needs to include various amplifiers having different characteristics to perform different degrees of gain amplification and different ranges of bandwidth processing. Such a method makes the hardware circuit cost increase greatly.

SUMMARY OF THE INVENTION

In consideration of the problem of the prior art, an object of the present invention is to supply a signal receiving apparatus and a programmable gain amplifier having mode-switching mechanism.

The present invention discloses a programmable gain amplifier having mode-switching mechanism that includes an operational amplifier, a variable resistor, a first switch, a first variable capacitor, a second switch, a second variable capacitor, a third switch, a low-pass resistor, a low-pass capacitor and an input resistor. The operational amplifier includes a first input terminal, a second input terminal and an output terminal, wherein the second input terminal is electronically coupled to a ground terminal, and the output terminal is configured to generate an output signal. The variable resistor and the first switch are electrically coupled in series between a first terminal and a second terminal, wherein the second terminal is electronically coupled to the first input terminal. The first variable capacitor and the second switch are electrically coupled in series between the first terminal and the second terminal. The second variable capacitor and the third switch are electrically coupled in series between the first terminal and the ground terminal. The low-pass resistor and the low-pass capacitor are electrically coupled in parallel between the first input terminal and the output terminal. The input resistor is electronically coupled to a signal input terminal and the first terminal and is configured to receive an input signal from the signal input terminal. The first switch, the second switch and the third switch are configured to be switched according to a set of mode switching signals to each form a path or an open-circuit.

The present invention also discloses a signal receiving apparatus that includes a programmable gain amplifier, an analog-to-digital conversion circuit and a digital signal processing circuit. The programmable gain amplifier includes an operational amplifier, a variable resistor, a first switch, a first variable capacitor, a second switch, a second variable capacitor, a third switch, a low-pass resistor, a low-pass capacitor and an input resistor. The operational amplifier includes a first input terminal, a second input terminal and an output terminal, wherein the second input terminal is electronically coupled to a ground terminal, and the output terminal is configured to generate an output signal. The variable resistor and the first switch are electrically coupled in series between a first terminal and a second terminal, wherein the second terminal is electronically coupled to the first input terminal. The first variable capacitor and the second switch are electrically coupled in series between the first terminal and the second terminal. The second variable capacitor and the third switch are electrically coupled in series between the first terminal and the ground terminal. The low-pass resistor and the low-pass capacitor are electrically coupled in parallel between the first input terminal and the output terminal. The input resistor is electronically coupled to a signal input terminal and the first terminal and is configured to receive an input signal from the signal input terminal. The analog-to-digital conversion circuit is configured to perform analog-to-digital conversion on the output signal. The digital signal processing circuit is electronically coupled to the output terminal through the analog-to-digital conversion circuit and is configured to receive the output signal after the analog-to-digital conversion is performed. The digital signal processing circuit is further configured to generate a set of mode switching signals such that the first switch, the second switch and the third switch are configured to be switched according to the set of mode switching signals to each form a path or an open-circuit.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a signal receiving apparatus and a programmable gain amplifier having mode-switching mechanism to switch between different modes with a single circuit according to the network communication of different transmission speeds and bandwidths such that different degrees of gain amplification and different ranges of bandwidth processing can be accomplished to lower the hardware circuit cost.

Figure 1:
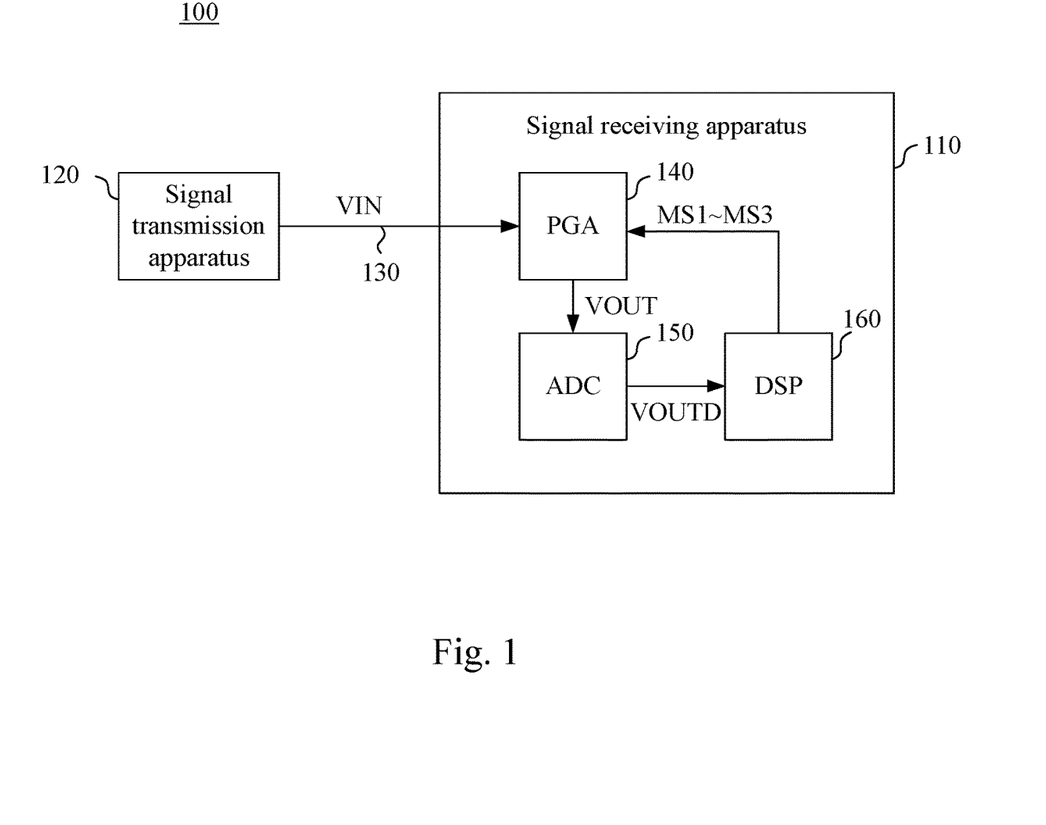
FIG. 1 illustrates a block diagram of a communication system according to an embodiment of the present invention.

Reference is now made to FIG. 1. FIG. 1 illustrates a block diagram of a communication system 100 according to an embodiment of the present invention. The communication system 100 includes a signal receiving apparatus 110, a signal transmission apparatus 120 and a wire 130.

The signal receiving apparatus 110 and the signal transmission apparatus 120 are electrically coupled to each other through the wire 130 and perform communication with each other, such that the signal receiving apparatus 110 receives an input signal VIN generated by the signal transmission apparatus 120 through the wire 130.

The signal receiving apparatus 110 includes a programmable gain amplifier 140 (abbreviated as PGA in FIG. 1), an analog-to-digital conversion circuit 150 (abbreviated as ADC in FIG. 1), and a digital signal processing circuit 160 (abbreviated as DSP in FIG. 1).

The programmable gain amplifier 140 is configured to perform amplification and filtering on the input signal VIN to generate an output signal VOUT. The analog-to-digital conversion circuit 150 performs analog-to-digital conversion on the output signal VOUT such that the digital signal processing circuit 160 receives the output signal VOUTD after the analog-to-digital conversion is performed.

Due to the differences of the transmission speed and the bandwidth of the network, the digital signal processing circuit 160 is configured to generate a set of mode switching signals MS1~MS3 according to different operation modes to control a configuration of the programmable gain amplifier 140 to perform different amounts of gain amplification and different frequency bands of filtering on the input signal VIN.

In an embodiment, the mode switching signals MS1~MS3 are generated by the digital signal processing circuit 160 according to a handshake process performed with the signal transmission apparatus 120. The digital signal processing circuit 160 determines the protocol of the communication performed between the signal receiving apparatus 110 and the signal transmission apparatus 120 according to the handshake process to further determine the gain amplification and the filtering required to be performed on the input signal VIN.

The configuration of the programmable gain amplifier 140 is described in detail in the following paragraphs.

Figure 2:
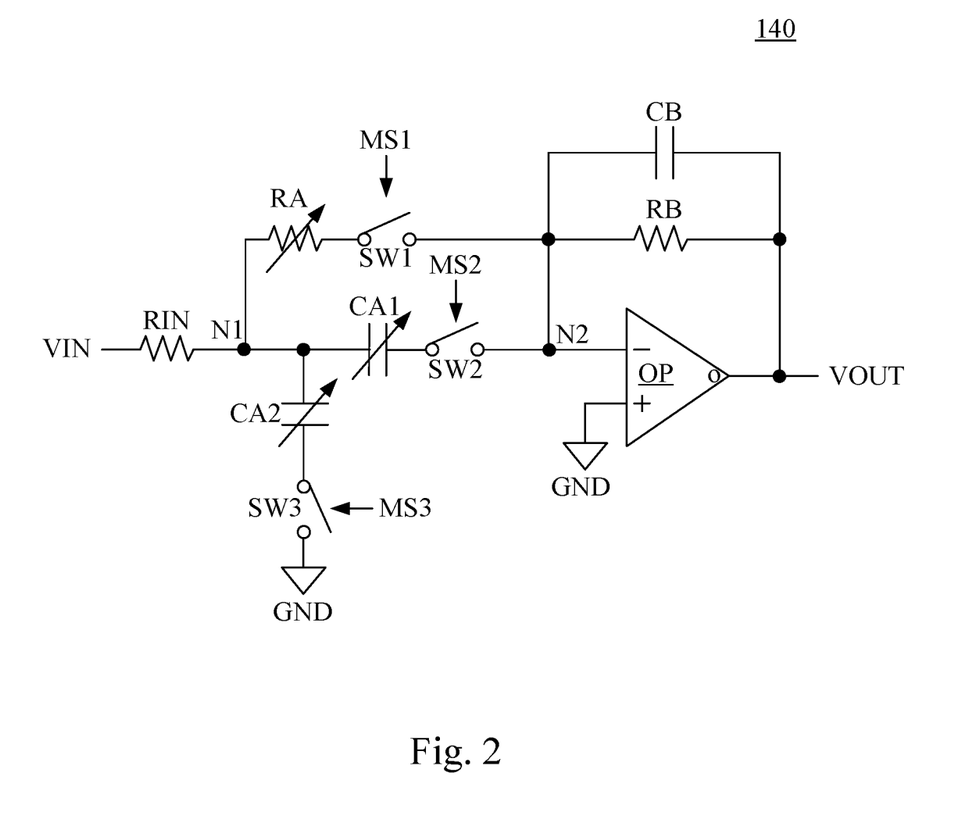
FIG. 2 illustrates a more detailed block diagram of the programmable gain amplifier according to an embodiment of the present invention.

Reference is now made to FIG. 2. FIG. 2 illustrates a more detailed block diagram of the programmable gain amplifier 140 according to an embodiment of the present invention. The programmable gain amplifier 140 includes an operational amplifier OP, a variable resistor RA, a first switch SW1, a first variable capacitor CA1, a second switch SW2, a second variable capacitor CA2, a third switch SW3, a low-pass resistor RB, a low-pass capacitor CB and an input resistor RIN.

The operational amplifier OP includes a first input terminal, a second input terminal and an output terminal. In FIG. 2, the first input terminal is an inverted input terminal and is labeled by a symbol '−'. The second input terminal is a non-inverted input terminal and is labeled by a symbol '+'. The output terminal is labeled by a symbol 'o'. The second input terminal is electronically coupled to ground terminal GND and the output terminal is configured to generate the output signal VOUT.

The variable resistor RA and the first switch SW1 are electrically coupled in series between a first terminal N1 and a second terminal N2, wherein the second terminal N2 is electronically coupled to the first input terminal N1.

The first variable capacitor CA1 and the second switch SW2 are electrically coupled in series between the first terminal N1 and the second terminal N2. The second variable capacitor CA2 and the third switch SW3 are electrically coupled in series between the first terminal N1 and ground terminal GND.

The low-pass resistor RB and the low-pass capacitor CB are electrically coupled in parallel between the first input terminal and the output terminal.

The input resistor RIN is electronically coupled between signal input terminal SIN and the first terminal N1 and is configured to receive the input signal VIN from the signal input terminal SIN.

As illustrated in FIG. 2, the mode switching signals MS1~MS3 are configured to control the first switch SW1, the second switch SW2 and the third switch SW3. The mode switching signal MS1 controls the first switch SW1, the mode switching signal MS2 controls the second switch SW2 and the mode switching signal MS3 controls the third switch SW3. The first switch SW1, the second switch SW2 and the third switch SW3 are configured to be switched according to the mode switching signals MS1~MS3 to each form a path or an open-circuit.

As a result, a gain and a filtering band relation between the output signal VOUT and the input signal VIN are determined according to a connection relation and a variable impedance of the variable resistor RA, the first variable capacitor CA1 and the second variable capacitor CA2 corresponding to the mode switching signals MS1~MS3.

The configurations of the programmable gain amplifier 140 under different modes are described in the following paragraphs.

Figure 3A:
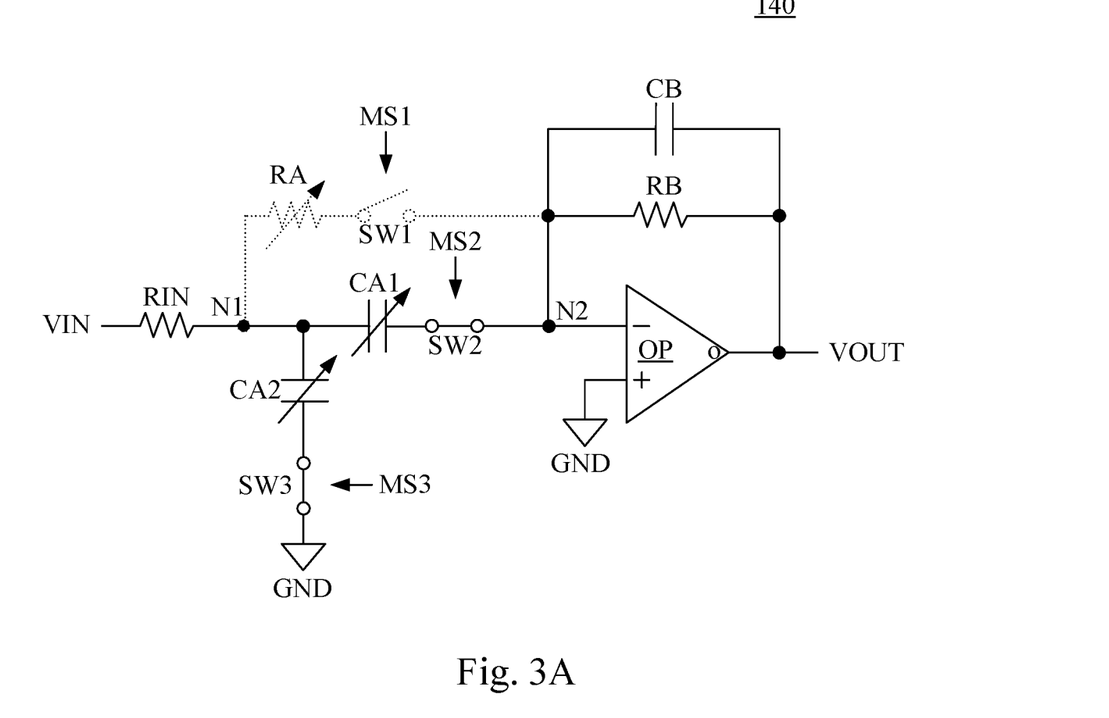
FIG. 3A illustrates a block diagram of the programmable gain amplifier under a band-pass filtering mode according to an embodiment of the present invention.
Figure 3B:
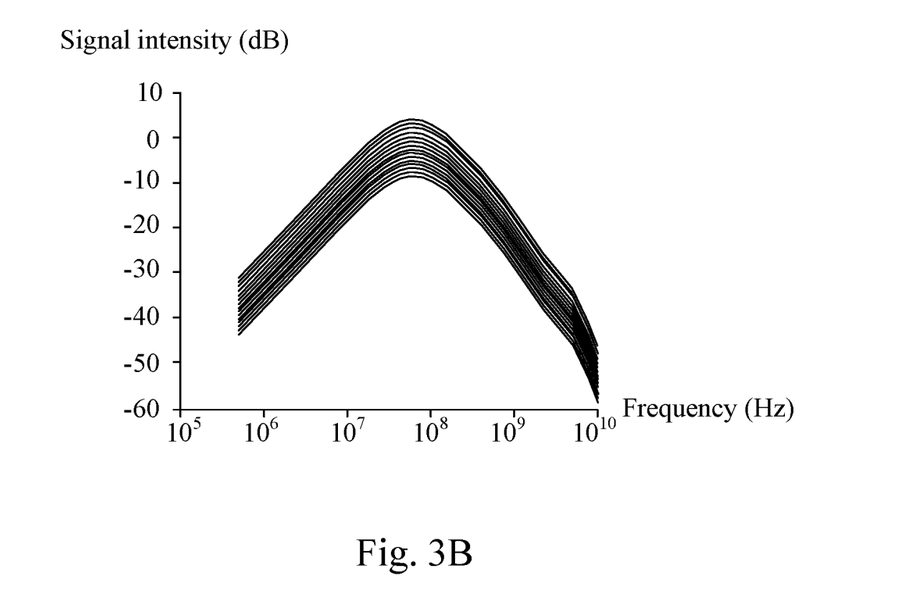
FIG. 3B illustrates a frequency response diagram of the programmable gain amplifier under the band-pass filtering mode according to an embodiment of the present invention.

Reference is now made to FIG. 3A and FIG. 3B at the same time. FIG. 3A illustrates a block diagram of the programmable gain amplifier 140 under a band-pass filtering mode according to an embodiment of the present invention. FIG. 3B illustrates a frequency response diagram of the programmable gain amplifier 140 under the band-pass filtering mode according to an embodiment of the present invention. In FIG. 3B, the X-axis represents signal frequency (in unit of Hz) and the Y-axis represents signal intensity (in unit of dB).

In an embodiment, the band-pass filtering mode corresponds to the input signal VIN transmitted in frequency bands of 5 GHz and 2.5 GHz.

As illustrated in FIG. 3A, in the band-pass filtering mode, the mode switching signals MS1~MS3 control the first switch SW1 to form the open-circuit and control each of the second switch SW2 and the third switch SW3 to form the path. The path related to the first switch SW1 is illustrated as a dashed line in FIG. 3A since such a path corresponds to the open-circuit.

Under such a condition, the first variable capacitor CA1 and the second variable capacitor CA2 form a high pass filter, and the low-pass resistor RB and the low-pass capacitor CB form a low pass filter. And these components together form a band-bass filter. Amounts of the variable impedances of the first variable capacitor CA1 and the second variable capacitor CA2 determine the amount of the current of the input signal VIN transmitted to the operational amplifier OP and further determine the amount of the gain.

As illustrated in FIG. 3B, different lines correspond to conditions of the signal under different gains. In FIG. 3B, the signal can be passed within the bands ranging from $10^6$ Hz to $10^{10}$ Hz.

Figure 4A:
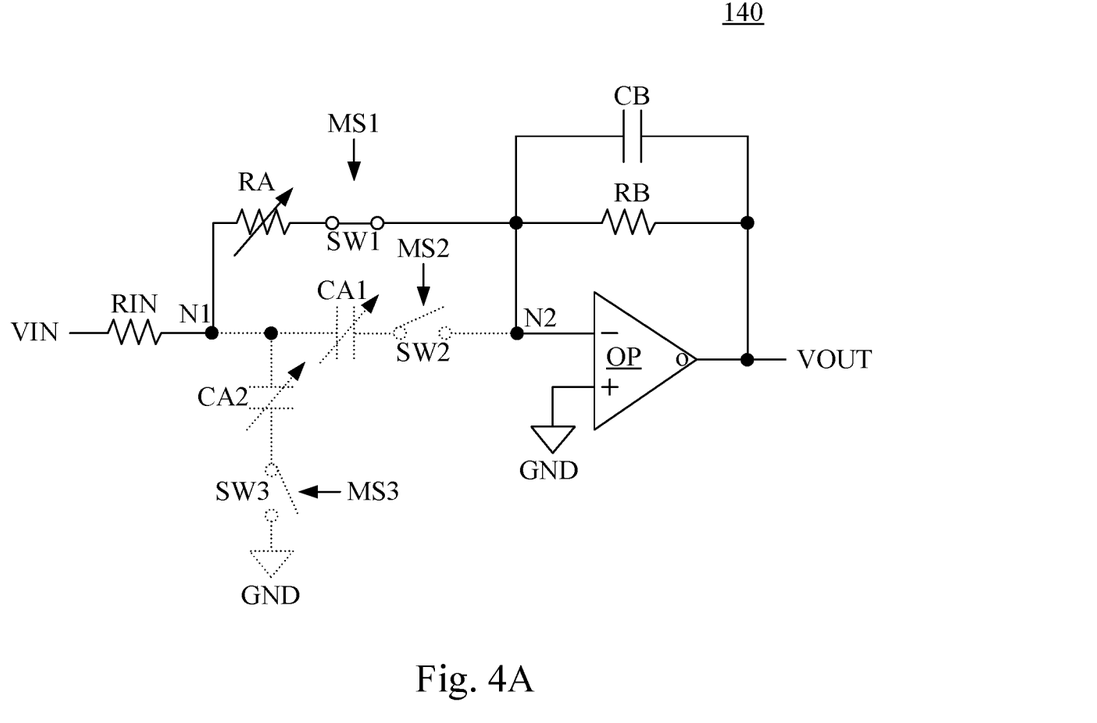
FIG. 4A illustrates a block diagram of the programmable gain amplifier under a low-pass filtering mode according to an embodiment of the present invention.
Figure 4B:
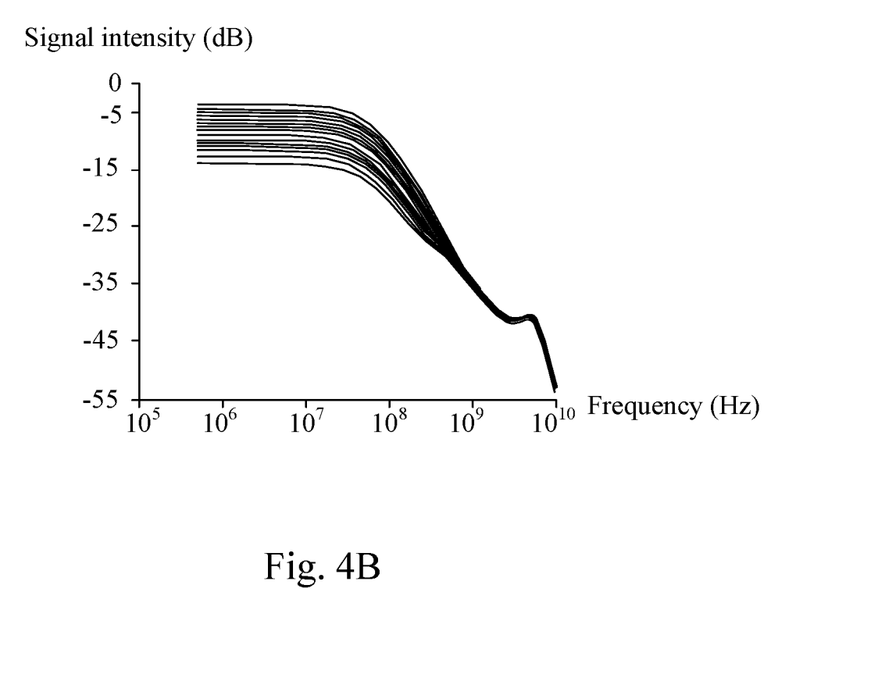
FIG. 4B illustrates a frequency response diagram of the programmable gain amplifier under the low-pass filtering mode according to an embodiment of the present invention.

Reference is now made to FIG. 4A and FIG. 4B at the same time. FIG. 4A illustrates a block diagram of the programmable gain amplifier 140 under a low-pass filtering mode according to an embodiment of the present invention. FIG. 4B illustrates a frequency response diagram of the programmable gain amplifier 140 under the low-pass filtering mode according to an embodiment of the present invention. In FIG. 4B, the X-axis represents signal frequency (in unit of Hz) and the Y-axis represents signal intensity (in unit of dB).

In an embodiment, the low-pass filtering mode corresponds to the input signal VIN transmitted in the frequency bands below 1 GHz (such as but not limited to 1 GHz, 100 MHz or 10 MHz).

In the low-pass filtering mode, the mode switching signals MS1~MS3 control the first switch SW1 to form the path and control each of the second switch SW2 and the third switch SW3 to form the open-circuit. The paths related to the second switch SW2 and the third switch SW3 are illustrated as dashed lines in FIG. 4A since these paths correspond to the open-circuit.

Under such a condition, the low-pass resistor RB and the low-pass capacitor CB form a low pass filter. The gain of the programmable gain amplifier 140 is proportional to a ratio between the impedance of the low-pass resistor RB and a sum of the impedances of the input resistor RIN and the variable resistor RA (i.e., RB/(RIN+RA)). An amount of the variable impedance of the variable resistor RA determines the amount of the gain.

As illustrated in FIG. 4B, different lines correspond to conditions of the signal under different gains. In FIG. 4B, the signal can be passed in the bands below $10^8$ Hz. However, the signal is attenuated in the bands above $10^8$ Hz.

Figure 5A:
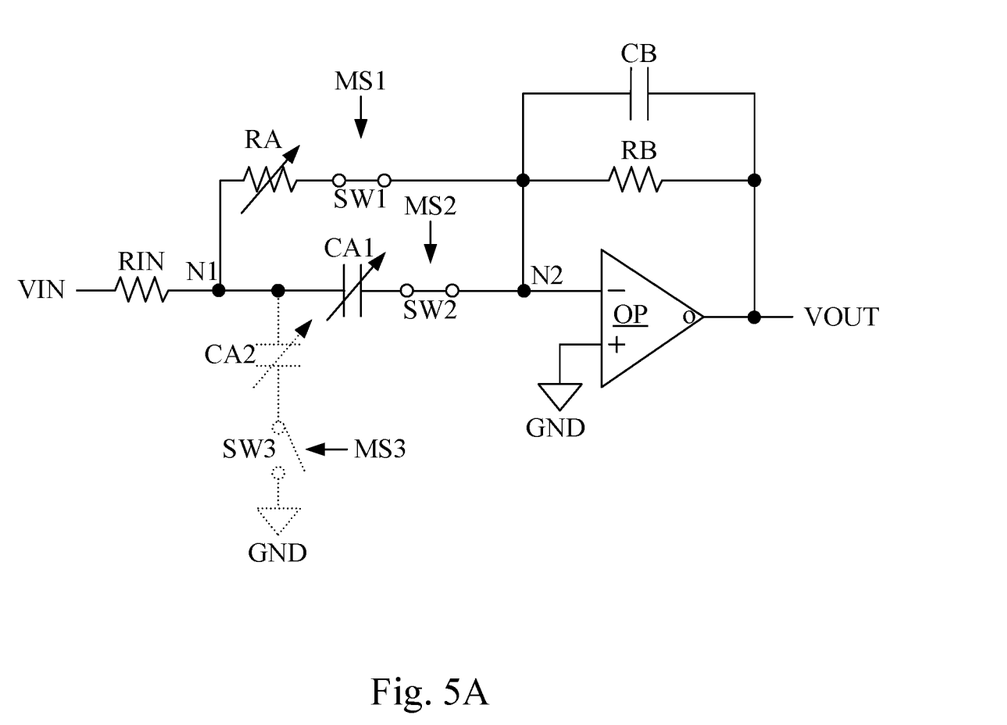
FIG. 5A illustrates a block diagram of the programmable gain amplifier under a continuous time linear equalizer (CTLE) mode according to an embodiment of the present invention.
Figure 5B:
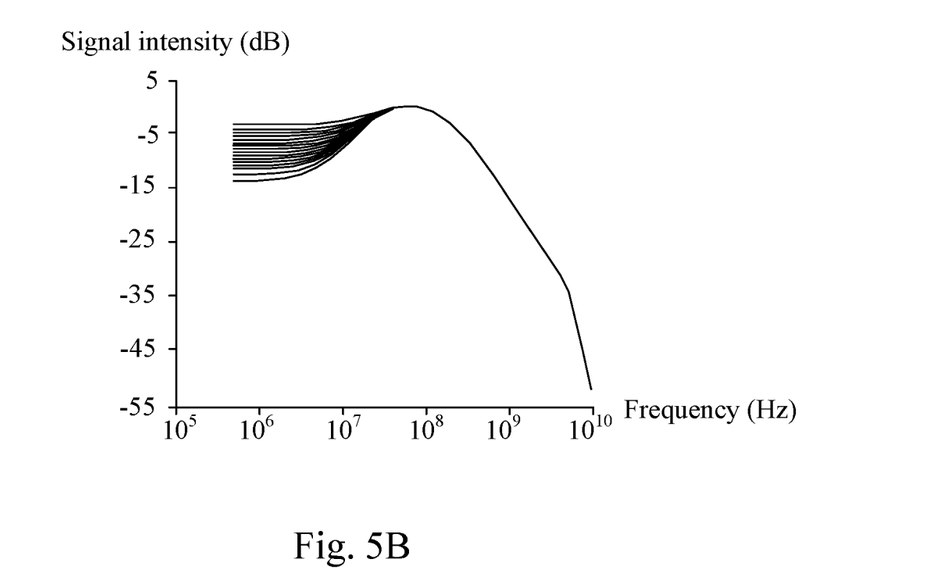
FIG. 5B illustrates a frequency response diagram of the programmable gain amplifier under the CTLE mode according to an embodiment of the present invention.

Reference is now made to FIG. 5A and FIG. 5B at the same time. FIG. 5A illustrates a block diagram of the programmable gain amplifier 140 under a continuous time linear equalizer (CTLE) mode according to an embodiment of the present invention. FIG. 5B illustrates a frequency response diagram of the programmable gain amplifier 140 under the CTLE mode according to an embodiment of the present invention. In FIG. 5B, the X-axis represents signal frequency (in unit of Hz) and the Y-axis represents signal intensity (in unit of dB).

In an embodiment, the CTLE mode corresponds to the input signal VIN transmitted in the frequency bands above 1 GHz and transmitted in the wire 130 having a wire length larger than a predetermined value.

In the CTLE mode, the mode switching signals MS1~MS3 control each of the first switch SW1 and the second switch SW2 to form the path and control the third switch SW3 to form the open-circuit. The path related to the third switch SW3 is illustrated as a dashed line in FIG. 5A since such a path corresponds to the open-circuit.

Under such a condition, the low-pass resistor RB and the low-pass capacitor CB form a low pass filter and the first variable capacitor CA1 and the variable resistor RA are coupled in parallel. Since the variable impedance of the first variable capacitor CA1 is an inverted product of the frequency and the capacitance, the variable impedance is smaller when the frequency is higher such that the impedance of the first variable capacitor CA1 and the low-pass resistor RB coupled in parallel becomes smaller. As a result, the impedance Z of the combination of the input resistor RIN, the first variable capacitor CA1 and the low-pass resistor RB, in which the input resistor RIN is coupled to the first variable capacitor CA1 and the low-pass resistor RB in series, is smaller as well.

The gain of the programmable gain amplifier 140 is proportional to a ratio between the impedance of the low-pass resistor RB and the impedance Z (i.e., RB/Z). The amounts of the variable impedances of the first variable capacitor CA1 and the variable resistor RA determine the amount of the gain.

As illustrated in FIG. 5B, different lines correspond to conditions of the signal under different gains. In FIG. 5B, the signal can be passed in the bands below $10^7$ Hz, can be boosted during the bands ranging from $10^7$ Hz to $10^8$ Hz and is attenuated in the bands above $10^8$ Hz.

In some approaches, when dealing with the network communication of different connection speeds and bandwidths, the signal receiving apparatus needs to include various amplifiers having different characteristics to perform different degrees of gain amplification and different ranges of bandwidth processing. Such a method make the hardware circuit cost increase greatly.

The programmable gain amplifier having mode-switching mechanism in the present invention switches between different modes with a single circuit according to the network communication of different transmission speeds and bandwidths such that different degrees of gain amplification and different ranges of bandwidth processing can be accomplished to lower the hardware circuit cost.

It is appreciated that the embodiments described above are merely an example. In other embodiments, it should be appreciated that many modifications and changes may be made by those of ordinary skill in the art without departing from the spirit of the disclosure.

In summary, the present invention discloses the signal receiving apparatus and the programmable gain amplifier having mode-switching mechanism that switch between different modes with a single circuit according to the network communication of different transmission speeds and bandwidths such that different degrees of gain amplification and different ranges of bandwidth processing can be accomplished to lower the hardware circuit cost.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A programmable gain amplifier having mode-switching mechanism comprising:
   an operational amplifier comprising a first input terminal, a second input terminal and an output terminal, wherein the second input terminal is electronically coupled to a ground terminal, and the output terminal is configured to generate an output signal;
   a variable resistor and a first switch electrically coupled in series between a first terminal and a second terminal, wherein the second terminal is electronically coupled to the first input terminal;
   a first variable capacitor and a second switch electrically coupled in series between the first terminal and the second terminal;
   a second variable capacitor and a third switch electrically coupled in series between the first terminal and the ground terminal;

a low-pass resistor and a low-pass capacitor electrically coupled in parallel between the first input terminal and the output terminal; and an input resistor electronically coupled to a signal input terminal and the first terminal and configured to receive an input signal from the signal input terminal;

wherein the first switch, the second switch and the third switch are configured to be switched according to a set of mode switching signals to each form a path or an open-circuit.

2. The programmable gain amplifier of claim 1, wherein a gain and a filtering band relation between the output signal and the input signal are determined according to a connection relation and a variable impedance of the variable resistor, the first variable capacitor and the second variable capacitor corresponding to the set of mode switching signals.

3. The programmable gain amplifier of claim 1, wherein in a band-pass filtering mode, the set of mode switching signals control the first switch to form the open-circuit and control each of the second switch and the third switch to form the path;

in a low-pass filtering mode, the set of mode switching signals control the first switch to form the path and control each of the second switch and the third switch to form the open-circuit; and in a continuous time linear equalizer (CTLE) mode, the set of mode switching signals control each of the first switch and the second switch to form the path and control the third switch to form the open-circuit.

4. The programmable gain amplifier of claim 3, wherein the band-pass filtering mode corresponds to the input signal transmitted in frequency bands of 5 GHz and 2.5 GHz, the low-pass filtering mode corresponds to the input signal transmitted in frequency bands below 1 GHz and the CTLE mode corresponds to the input signal transmitted in frequency bands above 1 GHz and transmitted in a wire having a wire length larger than a predetermined value.

5. The programmable gain amplifier of claim 1, wherein the input signal is generated by a signal transmission apparatus, the output terminal is further electronically coupled to a digital signal processing circuit through an analog-to-digital conversion circuit, and the set of mode switching signals are generated by a digital signal processing circuit according to a handshake process performed with the signal transmission apparatus.

6. A signal receiving apparatus comprising:
a programmable gain amplifier comprising:
an operational amplifier comprising a first input terminal, a second input terminal and an output terminal, wherein the second input terminal is electronically coupled to a ground terminal, and the output terminal is configured to generate an output signal;
a variable resistor and a first switch electrically coupled in series between a first terminal and a second terminal, wherein the second terminal is electronically coupled to the first input terminal;
a first variable capacitor and a second switch electrically coupled in series between the first terminal and the second terminal;

a second variable capacitor and a third switch electrically coupled in series between the first terminal and the ground terminal;

a low-pass resistor and a low-pass capacitor electrically coupled in parallel between the first input terminal and the output terminal; and an input resistor electronically coupled to a signal input terminal and the first terminal and configured to receive an input signal from the signal input terminal;

an analog-to-digital conversion circuit configured to perform analog-to-digital conversion on the output signal; and a digital signal processing circuit electronically coupled to the output terminal through the analog-to-digital conversion circuit and configured to receive the output signal after the analog-to-digital conversion is performed;

wherein the digital signal processing circuit is further configured to generate a set of mode switching signals such that the first switch, the second switch and the third switch are configured to be switched according to the set of mode switching signals to each form a path or an open-circuit.

7. The signal receiving apparatus of claim 6, wherein a gain and a filtering band relation between the output signal and the input signal are determined according to a connection relation and a variable impedance of the variable resistor, the first variable capacitor and the second variable capacitor corresponding to the set of mode switching signals.

8. The signal receiving apparatus of claim 6, wherein in a band-pass filtering mode, the set of mode switching signals control the first switch to form the open-circuit and control each of the second switch and the third switch to form the path;

in a low-pass filtering mode, the set of mode switching signals control the first switch to form the path and control each of the second switch and the third switch to form the open-circuit; and in a CTLE mode, the set of mode switching signals control each of the first switch and the second switch to form the path and control the third switch to form the open-circuit.

9. The signal receiving apparatus of claim 8, wherein the band-pass filtering mode corresponds to the input signal transmitted in frequency bands of 5 GHz and 2.5 GHz, the low-pass filtering mode corresponds to the input signal transmitted in frequency bands below 1 GHz and the CTLE mode corresponds to the input signal transmitted in frequency bands above 1 GHz and transmitted in a wire having a wire length larger than a predetermined value.

10. The signal receiving apparatus of claim 6, wherein the input signal is generated by a signal transmission apparatus and the set of mode switching signals are generated by the digital signal processing circuit according to a handshake process performed with the signal transmission apparatus.

* * * * *